United States Patent [19]

Kii et al.

[11] Patent Number: 5,290,665
[45] Date of Patent: Mar. 1, 1994

[54] PROCESS FOR DEVELOPING PS PLATE REQUIRING NO DAMPENING WATER WHEREIN THE DEVELOPER COMPRISES, WATER, A SOLUBILIZER AND AN ETHYLENE GLYCOL MONO(ALKYL $C_6$-$C_8$) ETHER DERIVATIVE

[75] Inventors: Mashafumi Kii; Susumu Yoshida; Yoshihiko Uraba; Hiroshi Takahashi, all of Shizuoka, Japan

[73] Assignee: Fuji Photo Film Co., Ltd., Minami-ashigara, Japan

[21] Appl. No.: 870,236

[22] Filed: Apr. 20, 1992

Related U.S. Application Data

[63] Continuation of Ser. No. 529,601, May 29, 1990, abandoned.

[30] Foreign Application Priority Data

Jun. 1, 1989 [JP] Japan ................................ 1-39558

[51] Int. Cl.$^5$ ........................ G03F 7/30; G03F 7/32; G03F 7/035
[52] U.S. Cl. ................................ 430/303; 430/272; 430/278; 430/284; 430/288; 430/309; 430/331
[58] Field of Search ............... 430/303, 331, 325, 309, 430/272, 284, 288, 278; 101/453, 456, 457, 463.1, 467

[56] References Cited

U.S. PATENT DOCUMENTS

| | | | |
|---|---|---|---|
| 3,996,054 | 12/1976 | Santemma et al. | 430/317 |
| 4,130,425 | 12/1978 | Boyd | 96/48 R |
| 4,416,976 | 11/1983 | Schell | 430/331 |
| 4,535,054 | 8/1985 | Brault et al. | 430/325 |
| 4,587,203 | 5/1986 | Brault et al. | 430/331 |
| 4,690,886 | 9/1987 | Naritomi et al. | 430/303 |
| 4,743,527 | 5/1988 | Yoshida et al. | 430/303 |
| 4,959,296 | 12/1988 | Yoshida et al. | 430/303 |
| 4,963,472 | 10/1990 | Schlosser et al. | 430/303 |
| 5,230,989 | 7/1993 | Urabe et al. | 430/303 |

FOREIGN PATENT DOCUMENTS

| | | |
|---|---|---|
| 1243876 | 11/1988 | Canada . |
| 0037060 | 7/1981 | European Pat. Off. . |
| 0134407 | 3/1985 | European Pat. Off. . |
| 0320945 | 6/1989 | European Pat. Off. . |

*Primary Examiner*—Charles L. Bowers, Jr.
*Assistant Examiner*—John S. Chu
*Attorney, Agent, or Firm*—Burns, Doane, Swecker & Mathis

[57] ABSTRACT

Disclosed is a process for developing a presensitized plate which is used in making a lithographic printing plate requiring no dampening water and which comprises, on a substrate, a photopolymerizable adhesive layer and a silicone rubber layer in the order, said process comprising water as a main component and at least one ethylene glycol derivative represented by the following general formula (I):

$$C_mH_{2m+1}-(OCH_2CH_2)_n-OH \qquad (I)$$

(wherein m is an integer of 5 to 8 and n is 1 or 2). According to the present invention, the developer is excellent in safety, in developing ability and in half-tone dots reproduction.

18 Claims, No Drawings

PROCESS FOR DEVELOPING PS PLATE REQUIRING NO DAMPENING WATER WHEREIN THE DEVELOPER COMPRISES, WATER, A SOLUBILIZER AND AN ETHYLENE GLYCOL MONO(ALKYL C6-C8) ETHER DERIVATIVE

This application is a continuation of application Ser. No. 07/529,601, filed May 29, 1990, now abandoned.

BACKGROUND OF THE INVENTION

The present invention relates to a developer used for developing a presensitized plate ("water-less PS plate") for use in making a lithographic printing plate which has a silicone rubber layer as an ink repellent layer and requires no dampening water during printing ("water-less lithographic printing plate"). More specifically, the present invention relates to a developer for a water-less PS plate which is excellent in safety, in developing ability and in half-tone dots reproduction.

There have already been proposed various kinds of water-less PS plates for lithographic printing plates having a silicone rubber layer as an ink repellent layer. In particular, those disclosed in, for instance, Japanese Patent Publication for Opposition Purpose (hereunder referred to as "J.P. KOKOKU") Nos. Sho 54-26923 and Sho 56-23150 comprise, on a substrate, a photopolymerizable adhesive layer and a silicone rubber layer in this order. This water-less PS plate is imagewise exposed to actinic rays through a positive film which is in close contact with the PS plate under vacuum, only the silicone rubber layer on the unexposed portions of the exposed water-less PS plate is selectively peeled off by dipping the exposed plate in a developer consisting of or mainly comprising a parafinic hydrocarbon to expose the unexposed photopolymerizable adhesive layer below it and to thus form ink-receptive image portions. On the other hand, the silicone rubber layer on the exposed portions gets swollen with the developer, but is strongly adhered to the photopolymerizable adhesive layer and, therefore, remains on the surface of the plate. The latter portions serve as ink-repellent non-image portions. In this way, a water-less lithographic printing plate is formed.

The water-less lithographic printing plate obtained through such a plate-making process often exhibits low fine half-tone dots reproduction when it is incompletely developed, because a part of the silicone rubber layer remains even on the portions from which it should completely be peeled off or removed. Moreover, when the plate surface is rubbed excessively strongly, even the silicone rubber layer, which must be positioned on the surface of the printing plate and serves as the non-image portions, is damaged.

Under such circumstances, to improve the developability of a water-less PS plate, there is proposed a method in which a polar solvent capable of dissolving even the photopolymerizable adhesive layer is added to the developer to dissolve a part of the light-sensitive layer while the silicone rubber layer is removed by rubbing the plate surface. However, the light-sensitive layer of the non-image portions also gets swollen to some extent as the amount of the polar solvent increases and, as a result, the silicone rubber layer on the non-image portions is also rubbed off. On the other hand, if the amount of the polar solvent is insufficient, a satisfactory effect to be attained by the addition cannot be expected.

J.P. KOKOKU No. Sho 63-21890 (=U.S. Pat. No. 4,378,423) proposes the use of a specific propylene oxide compound among polar solvents, which improves the developing ability of the developers. In addition, the resulting developers do not dissolve out the light-sensitive layer of the image portions and do not swell the light-sensitive layer of the non-image portions even if the amount of the propylene oxide compound is increased. Therefore, the developers can provide a lithographic printing plate wherein the shadowed portions comprising fine half-tone dots of the silicone rubber are sufficiently reproduced.

However, the developer consists of 100% organic solvents and, therefore, they suffer from a problem of safety because it may easily catch fire.

Under such circumstances, the present inventors have made intensive studies for providing a developer for water-less PS plates having a silicone rubber layer as an ink repellent layer, which developer does not ignite under the usual conditions by solubilizing it in water, and have tried to prepare a developer for water-less PS plates mainly comprising water to which the foregoing propylene oxide compound is added according to the methods disclosed in Japanese Patent Unexamined Publication (hereunder referred to as "J.P. KOKAI") No. Hei 1-159644 (EP0320945A) and J.P. KOKAI No. Sho 61-275759. However, the inventors failed to develop such a developer because the propylene oxide compound is highly soluble in water.

SUMMARY OF THE INVENTION

Accordingly, the object of the present invention is to provide a developer for water-less PS plates which is excellent in safety, in developing ability and in half-tone dots reproduction.

The present inventors have conducted various studies to achieve the foregoing object and, as a result, have found out that when a specific ethylene glycol derivative is used even in a small amount, there can be obtained a developer for water-less PS plates, which developer has a developing ability sufficient to remove a silicone rubber layer on image areas as well as excellent half-tone dots reproduction. The present invention has been completed based on this finding.

Namely, the present invention relates to a developer for water-less PS plates comprising, on a substrate, a photopolymerizable adhesive layer and a silicone rubber layer in this order, the developer mainly comprising water to which developer the ethylene glycol derivative represented by the following general formula (I) is added:

$$C_mH_{2m+1}-(OCH_2CH_2)_n-OH \qquad (I)$$

(wherein m is an integer of 5 to 8 and n is 1 or 2).

DETAILED EXPLANATION OF THE INVENTION

The developer of the present invention will be explained in more detail below.

The ethylene glycol derivative represented by the general formula (I) may be used alone or as a combination thereof and its amount ranges from 1 to 40% by weight, preferably 5 to 15% by weight.

The developer of the present invention can be obtained by dissolving the ethylene glycol derivative in water or by solubilizing it in water with the aid of a solubilizer. Specific examples of the ethylene glycol derivative include diethylene glycol mono-n-pentyl ether, diethylene glycol mono-n-hexyl ether, diethylene glycol mono-n-heptyl ether, diethylene glycol mono-n-octyl ether, ethylene glycol mono-n-pentyl ether, ethylene glycol mono-n-hexyl ether, ethylene glycol mono-n-heptyl ether and ethylene glycol mono-n-octyl ether.

The developer may optionally comprise an organic acid and/or an amine for improving its developing ability, which are selected depending on the kinds of photopolymerizable adhesive layers of water-less PS plates. Specific examples of such organic acids are acetic acid, propionic acid, n-butyric acid, isobutyric acid, n-valeric acid, isovaleric acid, methylethylacetic acid, trimethylacetic acid, caproic acid, isocaproic acid, α-methylvaleric acid, 2-ethyl-n-butyric acid, enanthic acid, capliric acid, 2-ethylhexanoic acid and lactic acid; and specific examples of such amines are methylamine, ethylamine, dimethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, benzylamine, N,N-dimethyl-benzylamine, N,N-diethyl-benzylamine, o-, m- or p-methoxy- or methyl-benzylamine, N,N-di-(methoxybenzyl)amine, β-phenylethylamine, γ-phenylpropylamine, cyclohexylamine, α- or β-naphthylamine, o-, m- or p-phenylenediamine, monoethanolamine, diethanolamine, triethanolamine, 2-methylaminomethanol, 2-ethylaminoethanol, 2-(2-aminoethyl)ethanol, 2-amino-2-methyl-1,3-propanediol, 2-amino-1,3-propanediol, 2-amino-2-hydroxymethyl-1,3-propanediol, 3-methoxypropylamine, 3-ethoxypropylamine, 3-propoxypropylamine, 3-isopropoxypropylamine, 3-butoxypropylamine, 3-isobutoxypropylamine, 2-ethylhexyloxypropylamine, 2-ethoxyethylamine. 2-propoxyethylamine and 2-butoxyethylamine.

As a solubilizer, various compounds which can solubilize the ethylene glycol derivative in water may be used.

Preferred solubilizers include a surfactant and a water-soluble aromatic compound.

As a surfactant for solubilizing the ethylene glycol derivative in water, there may be used any surfactants such as anionic, nonionic, cationic and amphoteric ones. In particular, anionic surfactants are desirable.

Examples of anionic surfactants are fatty acid salts, alkanesulfonic acid salts, hydroxyalkanesulfonic acid salts, dialkylsulfosuccinic acid salts, linear alkylbenzenesulfonic acid salts, branched alkylbenzenesulfonic acid salts, alkylnaphthalene-sulfonic acid salts, alkyl diphenyl ether sulfonic acid salts, alkylphenoxy polyoxyethylene propylsulfonic acid salts, polyoxyethylene alkylsulfophenyl ether salts, sodium N-methyl-N-oleyl-taurine, disodium N-alkylsulfosuccinic acid monoamide, petroleum sulfonic acid salts, sulfated castor oil, sulfuric acid ester salts of alkyl fatty acid esters, alkyl sulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially esterified products of styrene-maleic anhydride copolymers, partially esterified products of olefin-maleic anhydride copolymers, polyoxyethylene naphthyl ether sulfuric acid ester salts and naphthalenesulfonic acid salt-formalin condensates.

Particularly preferably used are alkylnaphthalenesulfonic acid salts, alkyl diphenyl ether sulfonic acid salts, linear alkylbenzenesulfonic acid salts, polyoxyethylene alkylphenyl ether sulfuric acid ester salts and polyoxyethylene naphthyl ether sulfuric acid ester salts. These surfactants are in general used in an amount of 0.01 to 20% by weight.

In the developer of the present invention, only a small amount of a surfactant is used to solubilize the ethylene glycol derivative and optional other additives in water, because the ethylene glycol derivative per se serves as a surfactant and, therefore, the content of the overall organic substances becomes small as compared with that for the usual water-based developers. This is also one of important features of the present invention.

As a water-soluble aromatic compound for solubilizing the ethylene glycol derivative in water, there may be used the compound represented by the following general formula (II):

$$(R^1)_m Ar—Y^-·M^+ \qquad (II)$$

wherein, $R^1$ represents H, $CH_3$, $C_2H_5$, $OCH_3$, $OC_2H_5$, OH, COOM, $SO_3M$, CN, Cl or Br; Ar represents an aryl group; Y represents COO, $SO_3$ or $PO_3$; M represents Na, K, Ca, Li or $NH_4$; and m represents an integer of 1 to 3.

Examples of the water-soluble aromatic compounds represented by the general formula (II) include sodium benzenesulfonate, sodium m-bezenedisulfonate, ammonium benzenesulfonate, sodium salicylate, sodium p-toluenesulfonate, sodium dimethylbenzenesulfonate, sodium p-chlor obenzenesulfonate, sodium benzoate, sodium p-methoxybenzoate, sodium p-ethoxy-benzoate, sodium o-, m-, and p- methylbenzoate, sodium o-, m-, and p-chlorobenzoate, sodium p-ethylbenzoate, sodium 1-naphthalene sulfonate, sodium 2-naphthalene sulfonate and the like.

The water-soluble aromatic compound can be preferably used in an amount of from 0.1 to 30% by weight based on the total weight of the developer.

In addition to the foregoing components, the developer may comprise a dye such as Crystal Violet or Astrazone Red, whereby image portions can be dyed simultaneously with the development.

Examples of water-less PS plates which are suitably developed with the developer of this invention are those comprising a silicone rubber layer as an ink-repellent layer, in particular those comprising, on a substrate, a photopolymerizable adhesive layer and a silicone rubber layer in this order.

The substrate of the PS plate must have flexibility sufficient for fitting the resulting water-less lithographic printing plate to a printing press and must withstand the load applied to the plate during the printing. Typical examples thereof are coated paper; metal plates such as plates of stainless steel, iron, aluminum and aluminum alloys; plastic films such as polyethylene terephthalate films; and paper or plastic films which are laminated with sheets of the foregoing metals or to which metal layers are deposited. Among these substrates, aluminum plate is particularly desirable because of its high dimensional stability and low cost.

The thickness of the photopolymerizable adhesive layer is not critical so far as the layer uniformly covers the surface of the substrate and is in close contact with the substrate, but it is preferably not more than 100μ, more preferably not more than 50μ. An anchor coat layer (or a primer layer) may optionally be formed between the substrate and the photopolymerizable adhesive layer for the purpose of improving the adhesion therebetween and to prevent halation.

The anchor coat may contain the epoxy resin as disclosed in J.P.KOKAI No. Sho. 61-54219 or may be made of urethane resin, phenolic resin, acrylic resin, alkyd resin, polyester resin, polyamide resin, melamine resin, and the like. The anchor coat may be a photocured layer of the composition similar to that of a light-sensitive layer. In addition, the anchor coat may contain an additive such as a dye and a pigment, for purposes of providing an antihalation effect or other effects.

The thickness of the anchor coat is suitable to be 1 to 50 g/m² in terms of coated amount.

The photopolymerizable adhesive layer may have the following composition.

(1) a photopolymerizable unsaturated monomer or oligomer having a boiling point of not less than 100° C. ... 0.0 to 99.9% by weight;
(2) a photosensitizer ... 0.1 to 20.0% by weight
(3) an optional heat polymerization inhibitor ... 0.01 to 20.0% by weight
(4) a polymer or inorganic powder as an optional filler for maintaining the shape of the photopolymerizable adhesive layer ... 0.01 to 95.0% by weight.

Typical examples of the photopolymerizable monomer or oligomer are (meth)acrylates or (meth)acrylamides having a boiling point of not less than 100° C. derived from monovalent alcohols or monovalent amines having not more than 30 carbon atoms; and (meth)acrylates or (meth)acrylamides having a boiling point of not less than 100° C. derived from polyhydric alcohols or polyvalent amines having not more than 80 carbon atoms.

Typical examples of the photosensitizer are benzophenone, bis(dialkylamino)benzophenone, xanthone, chloroxanthone, acridone, N-alkylacridone, N-alkylchloroacridone, benzoin methyl ether and dibenzylsulfide. The sensitizer may be used alone or as a combination thereof.

Typical examples of the heat polymerization inhibitor include hydroquinone, phenothiazine, 2,4-dinitrophenol and triphenylmethane.

Moreover, examples of the filler effectively usable are polymers such as (meth)acrylate copolymers, polyesters, polyurethanes, polyester urethanes and polyamides; and inorganic powder such as colloidal silica powder and calcium carbonate powder.

The thickness of the silicone rubber layer desirably ranges from 0.5 to 50 μm, preferably 0.5 to 5 μm. Examples of the silicone rubber are so-called condensation-type silicone rubber compositions mainly comprising linear organopolysiloxane (preferably dimethyl polysiloxane) having a molecular weight ranging from 100 to 100,000, which crosslinks through a condensation reaction between the termini; and so-called addition-type silicone rubber compositions obtained by reacting linear organopolysiloxanes having a vinyl group at each end or in the main chain, with a crosslinking agent having a methylhydrogensiloxane unit in the presence of a platinum catalyst.

The silicone rubber layer has ink repellency and its surface is sticky to some extent. Therefore, dusts are liable to deposit thereon and as a result, it is often observed that a positive film is not sufficiently in contact with the surface during the imagewise exposure of a PS plate. For this reason, a thin transparent protective film may be laminated on the surface of the silicone rubber layer. This protective film is useful in the process of imagewise exposure, but should be removed by peeling-off or dissolution during the development and is unnecessary in the printing process. Useful protective films are those which have transparency sufficient for ultraviolet rays to pass through the same and a thickness of not more than 100 μm, preferably not more than 10 μm. Typical examples thereof are films of the following materials: polyethylene, polypropylene, polyvinyl chloride, polyvinylidene chloride, polyvinyl alcohol, polyethylene terephthalate and cellophane.

It is also possible to form dot patterns on the surface of the protective film to facilitate the mounting of the positive film on a vacuum printing frame.

The positive film is mounted on the resultant water-less PS plate having the foregoing structure under vacuum using the conventional vacuum printing frame. The PS plate is irradiated with actinic rays through the film. In the case where the protective film is present, it is peeled off and then only the silicone rubber layer on the image portions can be peeled off by lightly rubbing the surface thereof with gauze or a soft pad of, for instance, nonwoven fabric using the developer of the present invention whereby the photopolymerizable adhesive layer of the image portions can be exposed.

If necessary, the exposed photopolymerizable adhesive layer may be dyed with a dying solution as disclosed in J.P. KOKAI No. Sho 54-103103.

The aforementioned processes can be performed with a plate-conveying type automatic developing machine which comprises a developing region and optionally a dying region, each of which is provided with a rotary brush so that it faces the plate. The rotary brush disposed in the developing region is preferably rotated along the plate-conveying direction and oscillated in the direction of the rotating shaft of the rotary brush, while the rotary brush disposed in the dying region is preferably rotated in the direction opposite to the plate-conveying direction. The developer and the dying solution are sprayed on the plate surface through a spray pipe in the developing and dying regions respectively.

The safety in the processing of the water-less PS plate can be enhanced by the use of the developer of the present invention having excellent developing ability and further there are provided water-less lithographic printing plates which are excellent in half-tone dots reproduction and which have no defects such as scratches.

The developer of the present invention will hereunder be described in more detail in reference to the following non-limitative working Examples and the effects practically attained by the invention will also be discussed in detail. In the following Examples and Comparative Examples, the term "%" means "% by weight" unless otherwise specified.

EXAMPLE 1

A smooth aluminum plate which had been degreased in the usual manner and processed with a sodium silicate aqueous solution was treated with a 0.1% aqueous solution of γ-aminopropyltrimethoxy-silane for 10 seconds and then dried at 140° C. for one minute. A titanium white dispersion having the following composition was applied onto the surface of the aluminum plate to form a primer layer. The coated amount thereof was 4.0 g/m² (on dry basis).

Titanium White Dispersion

| Component | Amount (part by weight) |
|---|---|
| Paraprene P26SRNAT (available from NIPPON POLYURETHANE Co., Ltd.) | 10 |
| TiO$_2$ | 1 |
| Methyl ethyl ketone | 60 |
| Dimethylsulfoxide | 20 |

A photopolymerizable light-sensitive composition having the following composition was applied onto the primer layer as formed to obtain a light-sensitive layer. The coated amount thereof was 2.0 g/m$^2$ (determined after drying).

Light-sensitive Composition

| Component | Amount (part by weight) |
|---|---|
| Polurethane comprising polyesterdiol of adipic acid/ethylene glycol/1,4-butanediol; 1,4-butanediol and isophorone diisocyanate | 2 |
| Adduct of glycidyl methacrylate with xylylenediamine (molar ratio = 4/1) | 0.45 |
| Compound of the following formula: CH$_2$=CH—CO—O—(CH$_2$CH$_2$O)$_4$—COCH=CH$_2$ | 0.45 |
| Compound of the following formula: | 0.1 |

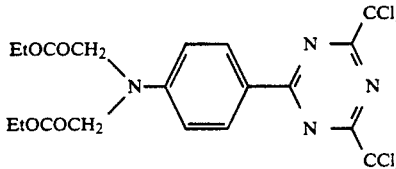

| | |
|---|---|
| Defenser MCF 323 (fluorine atom-containing surfactant available from DAINIPPON INK AND CHEMICALS, INC.) | 0.1 |
| Bromophenol Blue (pH indicator) | 0.01 |
| Propylene glycol monomethyl ether | 45 |
| Methyl ethyl ketone | 7 |

Then, a silicone rubber composition having the following composition was applied to the resultant light-sensitive layer so that the coated amount thereof was 2.0 g/m$^2$ (on dry basis) and drying the coated layer, to form a hardened silicone rubber.

Silicone Rubber Composition

| Component | Amount (part by weight) |
|---|---|
| Dimethylpolysiloxane having hydroxyl groups at both ends (molecular weight = about 70,000) | 90 |
| Methyltriacetoxysilane | 3 |
| Dibutyl tin dioctanoate | 1 |
| Isopar G (available from ESSO CHEMICALS CO., LTD.) | 1 |

The silicone rubber layer thus formed was laminated with a one side-matted OPP (biaxially oriented polypropylene) film having a thickness of 9 μm, to give a water-less PS plate. A positive film was superimposed on the water-less PS plate thus obtained and they were brought into close contact with one another under vacuum, imagewise exposed to light from the usual exposure apparatus, then the OPP film was peeled off, the exposed plate was immersed in the following developer for one minute and lightly rubbed with a developing pad for 1 to 2 minutes. Thus, only the silicone rubber layer on the non-exposed portions was removed.

Developer

| Component | Amount (part by weight) |
|---|---|
| Diethylene glycol mono-n-hexyl ether | 15 |
| New coal B4SN (available from NIPPON EMULSIFYING AGENT MANUFACTURING CO., LTD.: 60% aqueous solution of the following compound): | 1 |

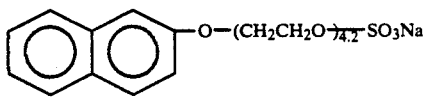

| | |
|---|---|
| Pure water | 84 |

The resulting water-less lithographic printing plate was mounted on a printing press ("LITHRONE" available from KOMORI PRINTING PRESS MANUFACTURING CO., LTD.) wherein the device for supplying dampening water had been removed, and the printing operation was performed. Thus, not less than 50,000 of good printed matters were obtained.

EXAMPLE 2

An aluminum plate was treated with the same silane coupling agent as used in Example 1 and the same primer layer as used in Example 1 was applied onto the resultant aluminum plate. The following photopolymerizable light-sensitive composition was applied on the primer layer so that the coated amount thereof was 2.0 g/m$^2$ (on dry basis) and then dried, to form a light-sensitive layer.

Light-sensitive Composition

| Component | Amount (part by weight) |
|---|---|
| Polyurethane comprising polyesterdiol of adipic acid/ethylene glycol/1,4-butanediol; 1,4-butanediol and isophorone diisocyanate | 2 |
| Adduct of glycidyl methacrylate with xylylenediamine (molar ratio = 4/1) | 0.45 |
| Compound of the following formula: CH$_2$=CH—CO—O—(CH$_2$CH$_2$O)$_{14}$—COCH=CH$_2$ | 0.45 |
| Compound of the following formula: | 0.1 |

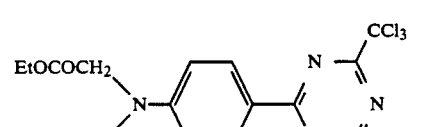

| | |
|---|---|
| Bromophenol Blue (pH indicator) | 0.01 |
| Propylene glycol monomethyl ether | 45 |
| Methyl ethyl ketone | 7 |

Then, the following silicone rubber composition was applied onto the light-sensitive layer as formed so that the coated amount thereof was 2.0 g/m$^2$ (on dry basis)

and drying the coated layer to form a silicone rubber layer.

Silicone Rubber Composition

| Component | Amount (part by weight) |
|---|---|
| Dimethylpolysiloxane having vinyl groups at both ends (molecular weight = about 55,000) | 90 |
| Polydimethylsiloxane (molecular weight = about 660,000) | 3 |
| Compolymer represented by the following averaged general formula and having trimethylsilyl groups at both ends (molecular weight = about 3,000): | 10 |

$$CH_3SiO\begin{pmatrix}CH_3\\|\\SiO\\|\\CH_3\end{pmatrix}\begin{pmatrix}H\\|\\SiO\\|\\CH_3\end{pmatrix}_{11}\begin{pmatrix}CH_3\\|\\SiO\\|\\CH_3\end{pmatrix}_{30}\begin{matrix}CH_3\\|\\SiCH_3\\|\\CH_3\end{matrix}$$

| Component | Amount (part by weight) |
|---|---|
| Olefin-chloroplatinic acid catalyst (10% toluene solution) | 1 |
| Isopar G (available from ESSO CHEMICALS CO., LTD.) | 1600 |

The silicone rubber layer thus formed was laminated with a one side-matted OPP (biaxially oriented polypropylene) film having a thickness of 9 μm to give a water-less PS plate.

A positive film was superimposed on the water-less PS plate thus obtained and they were closely adhered to one another under vacuum, imagewise exposed to light with the usual apparatus for exposure, then the laminated film was peeled off, the exposed plate was immersed in the following aqueous developer for one minute and lightly rubbed with a developing pad for 1 to 2 minutes. Thus, only the silicone rubber layer on the non-exposed portions was removed and thus, a water-less lithographic printing plate wherein images faithful to the original were reproduced was obtained.

Developer

| Component | Amount (part by weight) |
|---|---|
| Diethylene glycol mono-n-hexyl ether | 10 |
| Lactic acid | 5 |
| Pure water | 85 |

The resulting water-less lithographic printing plate was mounted on a printing press ("LITHRONE" available from KOMORI PRINTING PRESS MANUFACTURING CO., LTD.) wherein the device for supplying dampening water had been removed, and the printing operation was performed. Thus, not less than 50,000 of good printed matters were obtained.

EXAMPLE 3

An aluminum plate was treated with the silane coupling agent in the same manner as in Example 1 and the same primer layer as used in Example 1 was formed on the aluminum plate in the same way as Example 1. The following photopolymerizable light-sensitive composition was applied on the resultant primer layer so that the coated amount thereof was 2.0 g/m² (on dry basis) and then dried to form a light-sensitive layer.

Light-sensitive Composition

| Component | Amount (part by weight) |
|---|---|
| Polyurethane comprising polyesterdiol of adipic acid/ethylene glycol/1,4-butanediol; 1,4-butanediol and isophorone diisocyanate | 4 |
| Adduct of glycidyl methacrylate with xylylenediamine (molar ratio = 4/1) | 1 |
| Compound of the following formula: $CH_2=CH-CO-O-(CH_2CH_2O)_4-COCH=CH_2$ | 1 |
| Ethyl Michler's ketone | 0.1 |
| 2-Chlorothioxanthone | 0.1 |
| Bromophenol Blue (pH indicator) | 0.02 |
| Defenser MCF 323 (fluorine atom-containing surfactant available from DAINIPPON INK AND CHEMICALS, INC.) | 0.02 |
| Propylene glycol monomethyl ether | 85 |

Then, the same silicone rubber composition as used in Example 1 was applied onto the light-sensitive layer so that the coated amount thereof was 2.0 g/m² (on dry basis) and drying the coated layer, to form a silicone rubber layer. The silicone rubber layer as formed was laminated with a one side-matted OPP film having a thickness of 9 μm to give a water-less PS plate.

The water-less PS plate thus obtained was imagewise exposed to light in the usual manner, then the OPP film was peeled off, the exposed plate was immersed in the following aqueous developer for one minute and lightly rubbed with a developing pad for 1 to 2 minutes. Thus, only the silicone rubber layer on the non-exposed portions was removed.

Developer

| Component | Amount (part by weight) |
|---|---|
| Ethylene glycol mono-n-hexyl ether | 30 |
| New coal B4SN (available from NIPPON EMULSIFYING AGENT MANUFACTURING CO., LTD.: 60% aqueous solution) | 13 |
| Pure water | 57 |

With the resulting water-less lithographic printing plate, the printing was performed in the same manner as in Example 1. Thus, not less than 50,000 of good printed matters were obtained.

EXAMPLE 4

A positive-working water-less PS plate (TAP-HG; available from Toray Industries, Inc.) was imagewise exposed to light in the usual manner, the laminated film was peeled off, the plate was immersed in the aqueous developer used in Example 1 for one minute and lightly rubbed with a developing pad for 1 to 2 minutes. Thus, only the silicone rubber layer on the non-exposed portions was removed. With the resulting water-less lithographic printing plate, the printing was performed in the same manner as in Example 1. Thus, not less than 50,000 of good printed matters were obtained.

EXAMPLE 5

Example 1 was repeated except that a developer having the following composition was used, to form a water-less lithographic printing plate. Thus, only the silicone rubber layer on the unexposed area was clearly removed.

Developer

| Component | Amount (part by weight) |
| --- | --- |
| Diethylene glycol mono-n-hexyl ether | 6 |
| Sodium benzenesulfonate | 6 |
| Ion-exchanged water | 88 |

The printing operation was performed using the resultant printing plate in the same manner as Example 1. Thus, not less than 50,000 of good printed matter were obtained.

EXAMPLE 6

A positive film was laminated on a water-less PS plate (TAP; available from Toray Industries, Inc.) comprising a light-sensitive layer and a silicone rubber layer on a substrate and brought into close contact with the PS plate under vacuum. The PS plate was imagewise exposed using a conventional exposure device. Then, the laminated film was peeled off. The resultant PS plate was treated in an automatic developing device for a water-less PS plate (TWL 860; available from Toray Industries, Inc.) wherein the first and second baths were filled with the following developer, under the conditions that the temperature of the first bath was 35° C. and that of the second bath was room temperature. Thus, a water-less lithographic printing plate was obtained wherein only the silicone rubber layer on the unexposed area was removed and the image of the positive film was faithfully reproduced.

Developer

| Component | Amount (part by weight) |
| --- | --- |
| Diethylene glycol mono-n-hexyl ether | 6 |
| Sodium benzoate | 3.5 |
| Ion-exchanged water | 90.5 |

By consecutively conducting dyeing process using the same device wherein the third bath was filled with a dyeing solution (PA-2; available from Toray Industries, Inc.), a lithographic printing plate having good plate-examination property was obtained.

EXAMPLES 7-9

The imagewise exposed TAP was developed using TWL 860 wherein the first and second baths were filled with the developers as shown in Table 1 below. Good image reproduction was obtained in the same manner as Example 6.

TABLE 1

| | Example 7 | Example 8 | Example 9 |
| --- | --- | --- | --- |
| Diethylene glycol mono-n-hexyl ether | 6 part by weight | 6 part by weight | 6 part by weight |
| Sodium 2-naphthalene sulfonate | 0.5 part by weight | — | — |
| Sodium p-chlorobenzene sulfonate | — | 1.0 " | — |
| Sodium p-toluene sulfonate | — | — | 2.5 " |
| Ion-exchanged water | 93.5 " | 93 " | 91.5 " |

What is claimed is:

1. A process of preparing a lithographic printing plate requiring no dampening water which comprises imagewise exposing to light, a presensitized plate comprising a substrate having thereon, in order, a photopolymerizable adhesive layer and a silicone rubber layer and developing the imagewise exposed presensitized plate with a developer to remove only the silicone rubber layer in the light unexposed areas at the imagewise exposure thereby revealing the photopolymerizable adhesive layer in said areas, wherein said developer comprises:
   (i) water,
   (ii) at least one ethylene glycol derivative represented by the following general formula (I):

$$C_mH_{2m+1}-(OCH_2CH_2)_n-OH \qquad (I)$$

(wherein m is an integer of 6 to 8 and n is 1 or 2), and
   (iii) a solubilizer for solubilizing the ethylene glycol derivative in water.

2. The process of claim 1 wherein the amount of the ethylene glycol derivative ranges from 1 to 40% by weight.

3. The process of claim 2 wherein the amount of the ethylene glycol derivative ranges from 5 to 15% by weight.

4. The process of claim 1 wherein said ethylene glycol derivative is selected from the group consisting of diethylene glycol mono-n-hexyl ether, diethylene glycol mono-n-heptyl ether, diethylene glycol mono-n-octyl ether, ethylene glycol mono-n-hexyl ether, ethylene glycol mono-n-heptyl ether and ethylene glycol mono-n-octyl ether.

5. The process of claim 1 wherein said solubilizer is a surfactant.

6. The process of claim 5 wherein said surfactant is an anionic surfactant.

7. The process of claim 6 wherein said anionic surfactant is selected from the group consisting of fatty acid salts, alkanesulfonic acid salts, hydroxyalkanesulfonic acid salts, dialkylsulfosuccinic acid salts, linear alkylbenzenesulfonic acid salts, branched alkylbenzenesulfonic acid salts, alkylnaphthalenesulfonic acid salts, alkyl diphenyl ether sulfonic acid salts, alkylphenoxy polyoxyethylene propylsulfonic acid salts, polyoxyethylene alkylsulfophenyl ether salts, sodium N-methyl-N-oleyltaurine, disodium N-alkylsulfosuccinic acid monoamide, petroleum sulfonic acid salts, sulfated castor oil, sulfuric acid ester salts of alkyl fatty acid esters, alkyl sulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially esterified products of styrene-maleic anhydride copolymers, partially esterified products of olefin-maleic anhydride copolymers, polyoxyethylene naphthyl ether sulfuric acid ester salts and naphthalenesulfonic acid salt-formalin condensates.

8. The process of claim 7 wherein said anionic surfactant is selected from the group consisting of alkylnaphthalenesulfonic acid salts, alkyl diphenyl ether sulfonic acid salts, linear alkylbenzenesulfonic acid salts, polyoxyethylene alkylphenyl ether sulfuric acid ester salts and polyoxyethylene naphthyl ether sulfuric acid ester salts.

9. The process of claim 6 wherein the amount of said anionic surfactant ranges from 0.01 to 20% by weight.

10. The process of claim 1 wherein the developer further comprises an organic acid selected from the group consisting of acetic acid, propionic acid, n-butyric acid, isobutyric acid, n-valeric acid, isovaleric acid, methylethylacetic acid, trimethylacetic acid, caproic acid, isocaproic acid, α-methylvaleric acid, 2-ethyl-n-butyric acid, enanthic acid, capliric acid, 2-ethylhexanoic acid and lactic acid.

11. The process of claim 1 wherein the developer further comprises an amine selected from the group consisting of methylamine, ethylamine, dimethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, benzylamine, N,N-dimethyl-benzylamine, N,N-diethyl-benzylamine, o-, m- or p-methoxy- or methyl-benzylamine, N,N-di-(methoxybenzyl)amine, β-phenylethylamine, γ-phenylpropylamine, cyclohexylamine, α- or β-naphthylamine, o-, m- or p-phenylenediamine, monoethanolamine, diethanolamine, triethanolamine, 2-methylaminomethanol, 2-ethylaminoethanol, 2-(2-aminoethyl)ethanol, 2-amino-2-methyl-1,3-propanediol, 2-amino-1,3-propanediol, 2-amino-2-hydroxymethyl-1,3-propanediol, 3-methoxypropylamine, 3-ethoxypropylamine, 3-propoxypropylamine, 3-isopropoxypropylamine, 3-butoxypropylamine, 3-isobutoxypropylamine, 2-ethylhexyloxypropylamine, 2-ethoxyethylamine, 2-propoxyethylamine and 2-butoxyethylamine.

12. The process of claim 1 wherein the developer further comprises a dye.

13. The process of claim 12 wherein said dye is Crystal Violet or Astrazone Red.

14. The process of claim 1 wherein said photopolymerizable adhesive layer comprises:

(1) 1.0 to 99.9% by weight of a photopolymerizable unsaturated monomer or oligomer having a boiling point of not less than 100° C.;
(2) 0.1 to 20.0% by weight of a photosensitizer;
(3) 0.01 to 20.0% by weight of an optional heat polymerization inhibitor; and
(4) 0.01 to 95.0% by weight of a polymer or inorganic powder as an optional filler for maintaining the shape of the photopolymerizable adhesive layer.

15. The process of claim 1 wherein said silicone rubber layer is a condensation-type silicone rubber or an addition-type silicone rubber.

16. The process of claim 1 wherein said solubilizer is a water-soluble aromatic compound represented by the general formula (II):

$$(R^1)_m Ar—Y^-·M^+ \qquad (II)$$

wherein $R^1$ represents H, $CH_3$, $C_2H_5$, $OCH_3$, $OC_2H_5$, OH, COOM, $SO_3M$, CN, Cl or Br; Ar represents an aryl group; Y represents COO, $SO_3$ or $PO_3$; M represents Na, K, Ca, Li, or $NH_4$; and m represents an integer of 1 to 3.

17. The process of claim 16 wherein said water-soluble aromatic compound is selected from the group consisting of sodium benzenesulfonate, sodium m-benzenedisulfonate, ammonium benzenesulfonate, sodium solicylate, sodium p-toluenesulfonate, sodium dimethylbenzenesulfonate, sodium p-chlorobenzenesulfonate, sodium benzoate, sodium p-methoxybenzoate, sodium p-ethoxybenzoate, sodium o-, m-, and p-methylbenzoate, sodium o-, m-, and p-chlorobenzoate, sodium p-ethylbenzoate, sodium 1-naphthalenesulfonate and sodium 2-naphthalene sulfonate.

18. The process of claim 16 wherein the amount of said water-soluble aromatic compound ranges from 0.1 to 30% by weight based on the total weight of the developer.

* * * * *